United States Patent [19]

Bly

[11] 4,302,673
[45] Nov. 24, 1981

[54] TECHNIQUE FOR OPTICAL NON-UNIFORMITY CORRECTION OF AN IMAGING SYSTEM

[75] Inventor: Vincent T. Bly, Alexandria, Va.

[73] Assignee: The United States of America as represented by the Secretary of the Army, Washington, D.C.

[21] Appl. No.: 169,017

[22] Filed: Jul. 15, 1980

[51] Int. Cl.³ .......................... H01J 31/49; G01J 1/00
[52] U.S. Cl. .................................. 250/332; 250/342
[58] Field of Search ............... 250/330, 332, 338, 340, 250/342, 347, 349, 353

[56] References Cited

U.S. PATENT DOCUMENTS

| | | | |
|---|---|---|---|
| 3,536,917 | 10/1970 | Desvignes | 250/332 |
| 3,629,601 | 12/1971 | Firester | 250/330 |
| 4,160,907 | 7/1979 | Bly | 250/330 |
| 4,178,522 | 12/1979 | MacLennan et al. | 250/332 |
| 4,262,198 | 4/1981 | Gupta et al. | 250/340 |

Primary Examiner—Alfred E. Smith
Assistant Examiner—Janice A. Howell
Attorney, Agent, or Firm—Nathan Edelberg; Milton W. Lee; Max L. Harwell

[57] ABSTRACT

A technique for optical non-uniformity correction of a focal plane imaging system wherein incoming objective scene light rays impinging on each detector in a focal plane array is corrected on a pixel-by-pixel basis by optical correction means from a separate optical source. The optical correction means is comprised of a multiplicative correction means and an additive correction means. The multiplicative correction means is comprised of a responsivity mask positioned on or near the focal plane that provides a multiplicative factor of unity or less to each detector to cause more uniform sensitivity of the detectors. The additive correction means is comprised of the separate optical source that is positioned in a separate optical train and is comprised of an additive optical correction mask aligned with a light source and focusing screen means and image relay that relay the additive optical correction sensitizing illumination onto the focal plane array or the pixel-by-pixel basis. The additive correction may be used alone.

15 Claims, 3 Drawing Figures

TECHNIQUE FOR OPTICAL NON-UNIFORMITY CORRECTION OF AN IMAGING SYSTEM

The invention described herein may be manufactured, used and licensed by the U.S. Government for governmental purposes without the payment of any royalties thereon.

BACKGROUND OF THE INVENTION

1. Field of the Invention

The present invention may be in the field of optical non-uniformity correction in a non-scanning, i.e. staring focal plane imaging system, but is not limited thereto.

2. Description of the Prior Art

Due, in part, to the successful development of charge coupled devices (CCD's), there is an increased interest in non-scanned, i.e. staring imaging systems. Although these systems benefit from decreased mechanical complexity, they encounter significant problems when imaging low contrast scenes. Since many scenes of interest, such a far infrared scenes or visible scenes in the presence of fog or smoke, are of low contrast, some mechanism for suppressing the high background level is necessary. In a staring array, the simplest method of suppressing the background level is to subtract a fixed value in the output signal from each pixel. Unfortunately, this thresholding process requires extreme focal plane uniformity because it does not distinguish between small signals due to input flux differences and those due to non-uniformities in the focal plane itself such as, doping level or depth errors and crystalline faults. Further, in a CCD based staring array there is a second problem because the charge storage well is quickly filled by the high background flux. Although this problem can be alleviated by reading the array at a very high sampling rate, this sampling rate imposes a high speed requirement on any non-uniformity correcting mechanism, and thus causes a severe constraint on electronic correction systems which require high precision digital-to-analog converters.

The optical non-uniformity correction technique described herein below is independent of the sampling rate and is capable of correction to a much greater precision than possible with a simple responsivity mask.

SUMMARY OF THE INVENTION

The present inventive technique is a means for providing optical corrective signals to a focal plane detector array to provide uniform output response from each detector at a desired flux level. The overall means for providing these corrective signals is comprised of an additive correction means having a light source that emits an even flood of light that passes through a focusing screen, which is preferably a Fresnel lens and diffuser, out an additive optical correction mask. This additive correction mask is comprised of a two-dimensional array of neutral density elements in which each element is aligned with a corresponding detector in the detector focal plane array. The illuminated image of the additive correction mask is reimaged onto the detector focal plane array with a relay lens using a beam-splitter, and possibly, one or more folding mirrors for compactness. By this means, an extra flood of photons is added to the incident scene photons on each detector proportional to the transmittance of the corresponding neutral density element of the correction mask, thus providing the means for additive optical correction sensitizing illumination on a pixel-by-pixel basis. The overall means for providing uniformity correction may also be comprised of a multiplicative correction mask which spatially modulates, as a multiple of unity or less, the sum of the flux from the additive correction beam and the flux from the real world scene. The sensitivity of each detector is therefore controlled by both the additive and multiplicative correction means to provide uniform output from the focal plane at a desired operating point, or flux level.

To originally determine the amount of non-uniformity correction needed, the signal level from each pixel of the focal plane is obtained as a function of input flux level. This determination can be accomplished by digitizing the focal plane output with at least two different levels of uniform input flux. The digitization of the output need not be done in real time, or all at once. From the digitized data, the generation of a two-dimensional table of responsivity correction signals necessary for a more uniform response at the desired operating point, or flux level, may be formulated. The generated two-dimensional table of responsivity correction signals may be converted into optical densities, or neutral optical density filters in a stable medium by use of a computer controlled film reader-recorder, or a similar output device. The neutral density filter arrays generated by this means form the additive and multiplicative correction mask of the present inventive technique.

Several key features of the inventive correction means are as follows.

For applications where the system is intended for infrared imaging in the 3–5 $\mu$m or 8–12 $\mu$m spectral regions, the additive correction can still be made in the visible or near infrared. Therefore, the relay lens can be glass, the additive optical mask may be photographic film, and the light source may be a "grain-of-wheat" incandescent bulb, or a visible or near infrared (NIR) light emitting diode. This visible correction of an infrared imager is possible because semiconducting materials, such as Indium-Antimonide (InSb), Mercury-Cadmium-Telluride (HgCdTe), or Lead-Tin-Telluride (PbSnTe), have band gaps suitable for infrared detection and also absorb visible or NIR photons. Also, the beam-splitters may be an uncoated beam-splitter that does not represent a significant sensitivity loss since the light intensity of the additive correction beam can be a small fraction of the input scene flux level. In other words, using an easily available light souce, either an incandescent bulb or a light emitting diode, sufficient correction beam intensity of the detector focal plane can be achieved with a beam-splitter ratio of 1% to 5% reflection and 99% to 95% transmission. For either visible or infrared applications, an uncoated cellulose nitrate pellicle beam-splitter is a good choice. This choice has the advantage of being commercially available, providing the desired optical properties (about 5% reflectance and 95% transmission), and being thin enough so as not to introduce aberrations in the image formed by the system objective optics.

DETAILED DESCRIPTION OF THE INVENTION

Figure 2:
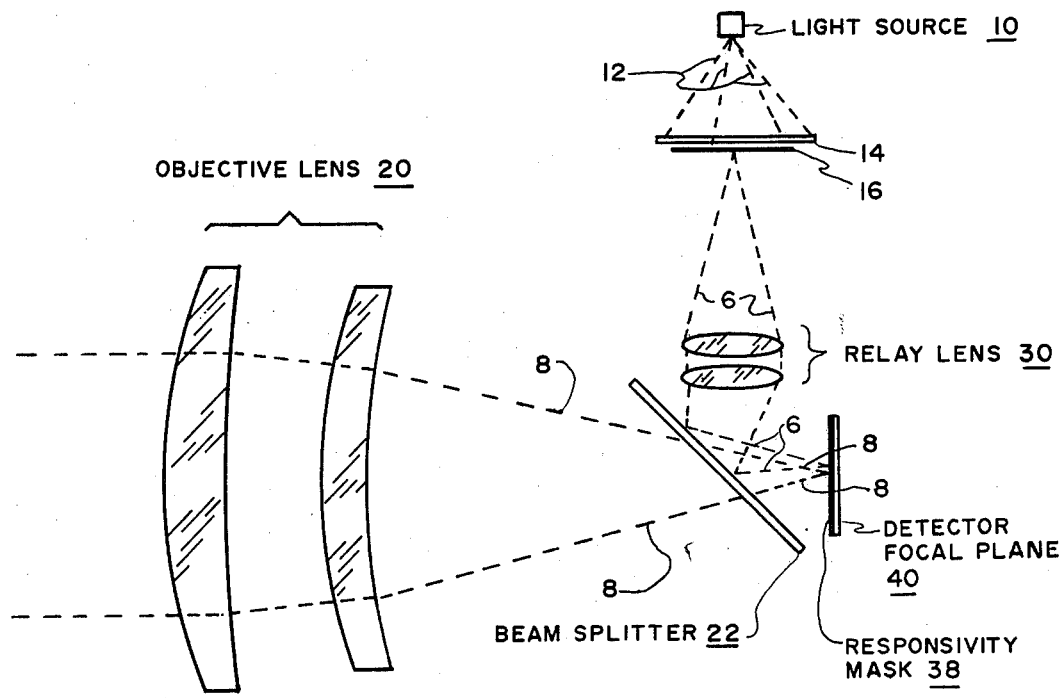
FIG. 2 shows one schematic-diagram view of the invention.
Figure 3:
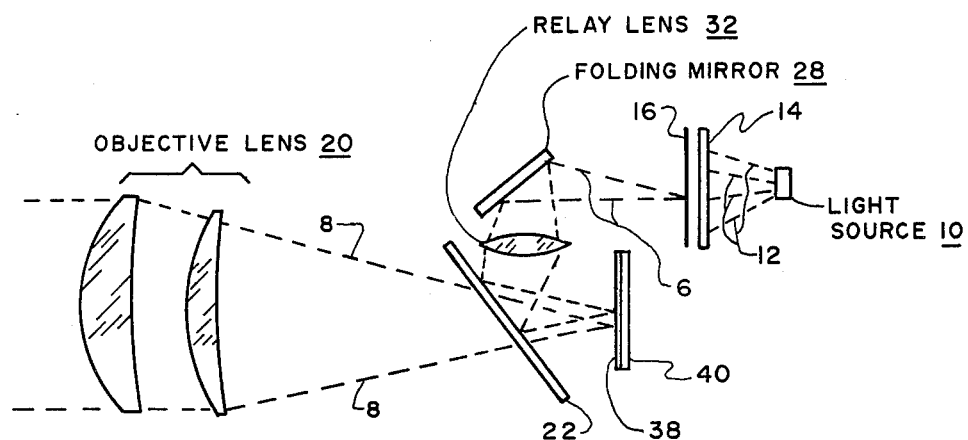
FIG. 3 illustrates another schematic-diagram view of the invention.

Refer to FIGS. 2 and 3 for two separate embodiments in which the present inventive means, for optical non-uniformity correction of fixed pattern noises in a focal plane array infrared imaging systems, may be practiced. Numerals 8 represent the marginal rays of an infrared bundle of radiation from some point in the scene that is transmitted and focussed by objective lens 20 through a beam splitter 22 and the multiplicative responsivity correction mask 38 onto one detector of the detector focal plane 40 as one set of many conjugate pairs from the scene being imaged. Numerals 6 represent marginal rays of additive optical correction illumination emanating from one point of a plurality of points on an additive optical correction mask 16. Marginal rays 6 may be thought of as being relayed to the very same detector as marginal rays 8 from the scene for correcting the sensitivity of each of the detectors. The additive correction means of the present invention is comprised of light source 10, which emits an even flood of either visible or near infrared radiation beams rays 12 therefrom through a focusing screen means 14 and onto the two-dimensional additive optical correction mask 16 from which a plurality of conjugate pairs of marginal rays 6 are relayed to various pixels on the focal plane 40 by a relay optics. The relay optics is comprised of relay lens, possibly one or more folding mirrors, and the reflective side of beam splitter 22. The relay lens of FIG. 2 is a double relay lens 30, while in FIG. 3 the relay means is a single relay lens 32. FIG. 3 shows a folding mirror 28 that provides more compactness. It should be noted that numerals 8 and 6 represent only one of a plurality of conjugate pairs from the objective scene and from correction mask 16 respectively and are illustrative of the sensitivity correction of only one detector of the detector focal plane array 40. Each of the plurality of conjugate pairs 6 correct optical non-uniformities in each of the detectors of focal plane 40 as an additive correction means. Also, possibly working in combination with the additive correction means is the multiplicative correction means, which is comprised of the responsivity correction mask 38. It should also be noted that the responsivity mask 38 may not be needed when the detector sensitivities are very close to each other. The amount of correction needed is originally determined with neither of the correction means in the infrared imaging system. As stated above, to originally determine the amount of non-uniformity correction needed, the signal level from each pixel is determined by digitizing data obtained at the output of the focal plane as a function of at least two input flux levels. From the digitized data a two-dimensional table of responsivity correction signals necessary for uniform response at the desired operating point, or flux level, is formulated. If the digitized data shows a very small sensitivity difference, of say 2% or less, between the most sensitive and the least sensitive detectors, the multiplicative correction means may be omitted entirely and only the additive correction means used. However, if the sensitivity differences are large, the multiplicative correction means is used to initially provide more uniformity of the detector sensitivity. Both the additive optical correction mask 16 and the multiplicative responsivity mask 38 are originally produced by converting the digitized data at the output of the focal plane 40 into optical density filters in a stable medium forming the two-dimensional mask 16 and 38. The additive mask 16, which modulates the visible or near infrared additive correction beam, can be made from a photographic film or plate. The multiplicative mask 38, which must also modulate the far infrared object scene flux, must use materials which transmit both in the visible and far infrared, such as thin metal film neutral density filters on a barium fluoride substrate. The focusing screen means 14 is preferably Fresnel lens and diffuser, in which the Fresnel lens gathers beam rays 12 by bending the outermost diverging rays inward the most with less and less degree of bend until the central beam is bent the least amount and then transmits these gathered beam rays onto the diffuser which diffuses the gathered rays onto the additive otpical correction mask 16.

The responsivity correction mask 38 is placed over the plurality of detectors in array 40, with one filter aligned with each detector, and corrects according to the responsivity of the detecting element. Mask 38 may be deposited directly on the detecting array or be deposited on a transmitting substrate positioned very near the detecting array, or maybe at a conjugate focal plane. The responsivity correction mask 38 functions as an ND filter for the transmission of individual pixels. The multiplicative factor of the responsivity correction mask 38 is always unity or less such that the most sensitive detector is attentuated the most and the least sensitive detector is not attenuated at all. In the case of the additive correction means, the opposite effect is taking place on a pixel-by-pixel basis. That is, a small additive correction signal is added to each detector so that the largest correction signal is added to the least sensitive detector with no correction signal added to the most sensitive detector. It should be noted here that if the largest difference in sensitivity of the detectors in the array is more than 2%, the multiplicative responsivity mask narrows the relative sensitivities of the detectors toward the least sensitive and the additive correction means is transmitted through the responsivity correction mask adding the additive optical correction illumination increasingly from the least sensitive detector to the most sensitive detector. The multiplicative two-dimensional responsivity correction mask 38 is a partially reflective/transmissive mask whose transmission varies on a pixel-by-pixel basis as to the need. The two-dimensional additive optical correction mask 16 is a transparent mask whose least transparent area restricts light from the light source 10 to the most sensitive detector on array 40 and whose most transparent area allows the most light therethrough to the least sensitive pixel on array 40. Transparencies of the other areas vary between the least and most transparent areas to correct for optical non-uniformities of the detectors as required.

It should be noted that light source 10 is the determining factor for the subsequent matching wavelength of elements in the separate optical train, i.e. the additive optical train. The wavelengths of the focal plane materials should match those of the thin layer on the beamsplitter and any antireflection coating.

The technique described herein is intended to correct "fixed pattern noise," i.e. spatially varying noise that is constant in time. This type of "built-in" noise may result from variations in the thickness or composition of the sensitive elements, such as crystalline faults or doping levels or depth errors, or from lithographic errors resulting in variations in bias resistances, CCD well capacities, amplifier gains, etc. For example, assume that the signal from each detector varies linearly with input over some range of interest, as shown by the four detectors in FIG. 1, i.e. the signal may be expressed as, $$S_i = M_i F_i + b_i,$$

where
subscript i refers to the ith detector,
S = the signal out,
M = the responsivity,
F = the flux in, and
b = the constant offset.

Figure 1:
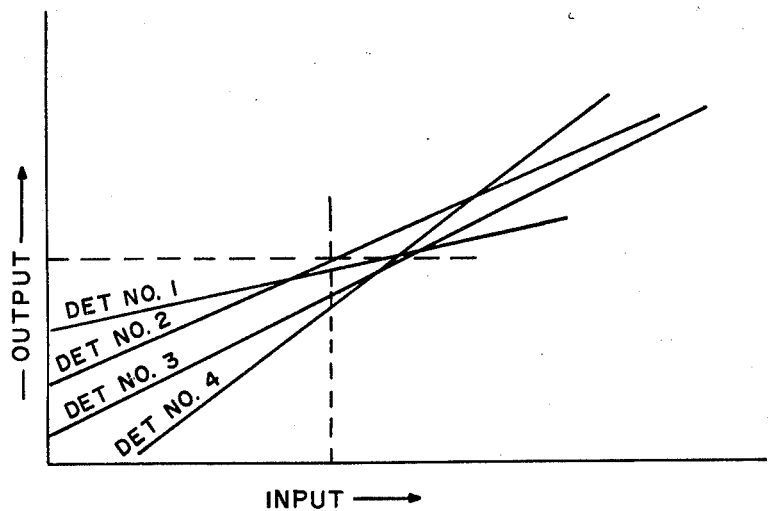
FIG. 1 illustrates the curves of four typical detectors with their nonuniformities greatly exaggerated and with the output at one operating point indicated as a dashed line.

The operation of the present optical correction technique is as follows: The linear curves for four typical detectors are shown in FIG. 1 with the differences, or non-uniformities, greatly exaggerated. The ordinate represents the output signal levels from these detectors and the abscissa represents the input flux level to these detectors. The vertical dashed line represents a chosen input operating point. A specific single correction will completely correct the output at this point by correcting all the detectors above the output sensitivity of one chosen detector. For a better understanding of the additive technique, let it be assumed that detector number 2 (DET No. 2) output signal, is indicated by the horizontal dashed line, is considered the nominal output at the operating flux level. The present technique would raise the output flux levels of detectors number 1, 3, and 4 by the added corrective flux, to provide the necessary output signal uniformity. When the output signals from all the detectors in the detector focal plane 40 are uniform, the objective scene image that is transmitted by objective lens 20 will be more exactly reproduced at the output of the focal plane 40. For some applications, such as the thermo-optical forward looking infrared system taught in U.S. Pat. No. 4,160,907 and issued to the present inventor, correction of all the outputs at one input operating point may be sufficient. It is anticipated that for some other applications, correction over a broad range of input flux levels may be desirable. Although several methods are available to extend the correction to a range of flux levels, this disclosure is drawn toward the one point flux level correction.

The results of the additive and multiplicative correcton means may be expressed as follows:

For the multiplicative correction means, $$S_i{}^1 = S_i \times CM_1, \quad (2)$$

For the additive correction means,
$$S_i{}^1 = S_i + CA_i \quad (3)$$

Where
subscript i refers to the ith detectors,
$S_i{}^1$ = the corrected detector output,
$S_i$ = the uncorrected detector output,
CM = the multiplicative correction,
CA = the additive correction.

In most practical cases, the original non-uniformities will be on the order of a percent or less; therefore, CM will be approximately unity and CA will be approximately two orders of magnitude smaller than S. Note that the effect of an error in either of the correction masks, namely the additive optical mask and the multiplicative responsivity mask, will be quite different for the multiplicative and additive means. In the multiplicative means, an error in CM will cause a residual error in $S_i$ of the same magnitude. In the additive means, an error in CA will cause a residual error in $S_i$ approximately two orders of magnitude smaller. It is this feature of additive correction that forms the salient improvement that signifies the invention described herein. This improvement over other known imaging systems may thus be summarized. When the original non-uniformities are small, corrections by use of the additive optical correction mask having a given precision results in overall uniformities substantially more precise percentage wise than the precision of the additive optical correction mask itself. In cases where the original non-uniformities are not small enough to benefit from this feature, the multiplicative responsivity mask can be used to make an initial approximate correction then the additive optical correction mask implemented therewith.

I claim:
1. In a focal plane array infrared imaging system, means of optical non-uniformity correction of fixed pattern noise, said means comprising:
   a multiplicative correction means for selectively limiting the sensitivity of each detector to the least sensitive detector of a plurality of detectors in said focal plane array; and
   an additive optical correction means for selectively adding sensitizing illumination to each of said plurality of detectors on a pixel-by-pixel basis to provide uniform output from said focal plane array at a desired operating flux level.

2. A means of optical non-uniformity correction as set forth in claim 1 wherein said multiplicative correction means is comprised of a responsivity correction mask overlaying said focal plane array which spatially modulates as a multiple of unity or less the sum of the flux from the additive optical correction means sensitizing illumination and the input scene flux.

3. A means of optical non-uniformity correction as set forth in claim 2 wherein said additive correction means is comprised of:
   a light source that emits an even flood of light therefrom;
   a focusing screen means for bending and focusing said light rays;
   an additive optical correction mask in optical alignment with said focusing screen means wherein said additive optical correction mask is a photographic film that has a two-dimensional array of neutral density elements with each element aligned with a corresponding detector in said focal plane array; and
   image relay optics for relaying said sensitizing illumination on a pixel-by-pixel basis from said additive optical correction mask onto said focal plane array wherein an extra flood of photons is added to the incident scene photons from the input scene on each detector in which the extra flood of photons is proportional to the transmittance of the corresponding neutral density element.

4. A means of optical non-uniformity as set forth in claim 3 wherein said focusing screen means is a Fresnel lens and diffuser.

5. A means of optical non-uniformity correction as set forth in claim 1 wherein said additive optical correction mask is a photographic film having a stable photographic transparency in accordance with a digitization of the focal plane output from each detector with application of at least two different levels of uniform input flux.

6. A means of optical non-uniformity correction as set forth in claim 5 wherein said image relay means is comprised of a relay lens and an uncoated cellulose nitrate pellicle beam-splitter.

7. A means of optical non-uniformity correction as set forth in claim 6 wherein said image relay means further comprises at least one folding mirror between said additive optical correction mask and said uncoated cellulose nitrate pellicle beam-splitter.

8. A means of optical non-uniformity correction as set forth in claim 6 wherein the wavelength of said light source is compatible with the wavelength of the focal plane array materials and the materials of said uncoated cellulose nitrate pellicle beam-splitter.

9. A means as set forth in claim 8 wherein said light source is in the visible to near infrared spectral regions, said relay lens is clear glass, and said focal plane array material are semiconducting materials with bandgaps suitable for infrared spectral region detection and absorb visible and near infrared photons.

10. A means as set forth in claim 8 wherein said light source is a light emitting diode.

11. A means as set forth in claim 10 wherein said uncoated cellulose nitrate pellicle beam-splitter has a ratio of 1% to 5% reflection and 99% to 95% transmission.

12. A means as set forth in claim 8 wherein said light source is a grain-of-wheat incandescent bulb.

13. A means as set forth in claim 9 wherein said focal plane array materials are Indium-Antimonide.

14. A means as set forth in claim 9 wherein said focal plane array materials are Mercury-Cadmium-Telluride.

15. A means as set forth in claim 9 wherein said focal plane array materials are Lead-Tin-Telluride.

* * * * *